United States Patent
Zhong

(10) Patent No.: US 9,681,226 B2
(45) Date of Patent: Jun. 13, 2017

(54) OPTICAL FIBER DECODING-BASED WIRELESS GAMING HEADSET

(71) Applicant: SHENZHEN BADASHENG ELECTRONICS CO., LTD, Shenzhen,Guangdong (CN)

(72) Inventor: Li Zhong, Guangdong (CN)

(73) Assignee: SHENZHEN BADASHENG ELECTRONICS CO., LTD, Shenzhen, Guangdong (CN)

( * ) Notice: Subject to any disclaimer, the term of this patent is extended or adjusted under 35 U.S.C. 154(b) by 0 days.

(21) Appl. No.: 15/031,265

(22) PCT Filed: Jan. 26, 2015

(86) PCT No.: PCT/CN2015/071537
§ 371 (c)(1),
(2) Date: Apr. 21, 2016

(87) PCT Pub. No.: WO2016/015460
PCT Pub. Date: Feb. 4, 2016

(65) Prior Publication Data
US 2016/0269824 A1  Sep. 15, 2016

(30) Foreign Application Priority Data
Jul. 30, 2014 (CN) .................... 2014 2 0423637 U

(51) Int. Cl.
*H04R 3/00* (2006.01)
*G06F 3/00* (2006.01)
(Continued)

(52) U.S. Cl.
CPC .............. *H04R 3/00* (2013.01); *G06F 3/162* (2013.01); *H03G 3/02* (2013.01); *H04R 1/08* (2013.01);
(Continued)

(58) Field of Classification Search
CPC ...... G06F 13/4081; G06F 3/162; G06F 13/00; A63F 13/332; H04R 1/1041; H04R 1/08;
(Continued)

(56) References Cited

U.S. PATENT DOCUMENTS

2006/0084504 A1* 4/2006 Chan .................. A63F 13/06
463/39
2009/0238396 A1* 9/2009 Lin .................... H04R 5/02
381/370

(Continued)

*Primary Examiner* — Thang Tran

(57) ABSTRACT

An optical fiber decoding-based wireless gaming headset includes: an audio digital signal interface (1), a transmitter (2), and a wireless headset body (3). The audio digital signal interface (1) is electrically connected with the transmitter (2). The transmitter (2) is in wireless communication connection with the wireless headset body (3). The audio digital signal interface (1) includes an optical fiber receiving head (11) for receiving a sound optical fiber signal generated by a game console and a USB interface (12). The transmitter (2) includes a photoelectric conversion circuit (21), a USB interface signal receiving circuit (22) and a first wireless transmitting module (23). The wireless headset body (3) includes left and right horns (31), a microphone (32), a second wireless transmitting module (33) and a DA/AD conversion circuit (34).

6 Claims, 1 Drawing Sheet

(51) Int. Cl.
*H04B 5/00* (2006.01)
*G06F 3/16* (2006.01)
*H03G 3/02* (2006.01)
*H04R 1/08* (2006.01)
*H04R 1/10* (2006.01)

(52) U.S. Cl.
CPC .......... *H04R 1/1025* (2013.01); *H04R 1/1041* (2013.01); *H04R 2420/07* (2013.01); *H04R 2420/09* (2013.01); *H04R 2430/01* (2013.01)

(58) Field of Classification Search
CPC ............ H04R 2420/07; H04R 2420/09; H04R 2430/01; H04R 3/00; H04R 5/033
See application file for complete search history.

(56) References Cited

U.S. PATENT DOCUMENTS

2010/0020983 A1* 1/2010 Waites ..................... H04R 5/04
 381/79
2012/0224725 A1* 9/2012 Prevot .................... G08C 17/02
 381/123

\* cited by examiner

OPTICAL FIBER DECODING-BASED WIRELESS GAMING HEADSET

CROSS REFERENCE OF RELATED APPLICATION

This is a U.S. National Stage under 35 U.S.C. 371 of the International Application PCT/CN2015/071537, filed Jan. 26, 2015, which claims priority under 35 U.S.C. 119(a-d) to CN 201420423637.7, filed Jul. 30, 2014.

BACKGROUND OF THE PRESENT INVENTION

Field of Invention

The present invention relates to the field of an audio player, and more particularly to a wireless headset capable of simultaneously receiving two types of acoustic signals.

Description of Related Arts

At present, the new consoles have problems in matching audio signals, e.g., the audio output interface of PS4 only has digital output interface such as HDMI (High-Definition Multimedia Interface) and optical fiber, no analog output interface of RCA (Radio Corporation of American) and 3.5 mm. The general gaming headsets are not capable of satisfying functional requirements of the consoles mentioned above. The general gaming headsets are not capable of achieving playing computer games while chatting with friends online. The reason lies in that game sounds generated by the console is optical fiber signals transmitted by fiber optics, and the sounds of the internet chat is electrical signal transmitted by cable. The receiving and processing manner of the two kinds of signals is different, so the general gaming headsets are not capable of processing simultaneously.

SUMMARY OF THE PRESENT INVENTION

An object of the present invention is to provide a wireless gaming headset which is capable of simultaneously receiving two acoustic signals and achieving playing games while chatting online.

Accordingly, in order to accomplish the above objects, the present invention provides an optical fiber decoding-based wireless gaming headset, comprising: an audio digital signal interface, an transmitter and a wireless headset body;

wherein the audio digital signal interface is electrically connected with the emitter, and the emitter is in a wireless communication connection with the wireless headset body;

the audio digital signal interface comprises an optical fiber receiving head for receiving a sound optical fiber signal generated by a game console and a USB interface for receiving online chatting digital signals;

the transmitter comprises a photoelectric conversion circuit, a USB interface signal receiving circuit and a first wireless transmitting module;

the wireless headset body comprises left and right horns, a microphone, a second wireless transmitting module and a DA/AD conversion circuit;

the fiber-optic receiving head is electrically connected with the first wireless transmitting module via a photoelectric conversion circuit, the USB interface is electrically connected with the first wireless transmitting module via the USB interface signal receiving circuit, the first wireless transmitting module is communicated with the second wireless transmitting module, the second wireless transmitting module is electrically connected with the DA/AD conversion circuit, the DA/AD conversion circuit is respectively connected with the left and right horns and the microphone.

Preferably, a chat volume controller and a game volume controller are respectively provided on the wireless headset body; the chat volume controller and the game volume controller are electrically connected with the second wireless transmitting module.

Preferably, a microphone muteness controller is provided on the wireless headset body, and the microphone muteness controller is electrically connected with the second wireless transmitting module.

Preferably, indicating lamps for indicating working states are respectively provided on the wireless headset body and the transmitter.

Preferably, the wireless headset body further comprises a charge jack, a charge management circuit, a lithium battery, a charging indicator, a power switch and a power supply circuit;

wherein the charge jack is connected with the lithium battery via the charge management circuit, the lithium battery is electrically connected with the power switch via the power supply circuit, the lithium battery powers elements of the headset body via the power supply circuit, the charge management circuit is electrically connected with the charging indicator.

Preferably, both a transmitting frequency and a receiving frequency of the first wireless transmitting module and the second transmitting module are 2.4 GHz.

Beneficial effects of the present invention are as follows. The present invention provides an optical fiber decoding-based wireless gaming headset, wherein the audio digital signal interface comprises two signal receiving devices of the fiber-optic receiving head and the USB interface. The fiber-optic receiving head and the USB interface respectively receive the sound optical fiber signal and an online chatting digital signal. The sound optical fiber signal received is converted to an electric signal via the photoelectric conversion circuit to be sent to the first wireless transmitting module. The online chatting digital signal is sent to the first wireless transmitting module via the USB interface signal receiving circuit. The first wireless transmitting module sends the two signals to the second wireless transmitting module, the DA/AD conversion circuit of the wireless headset body decodes the signals, and the signals are changed back to voice and then played by the left and right horns. Thus the optical fiber decoding-based wireless gaming headset of the present invention is not only capable of receiving game sounds but also online chat sounds. In addition, a microphone is provided on the wireless headset body, and the user is capable of chatting with friends via the microphone, so as to achieve playing games while chatting and accomplishing a better entertaining effect.

These and other objectives, features, and advantages of the present invention will become apparent from the following detailed description, the accompanying drawings, and the appended claims.

Reference numbers of main elements are as follows.

1—audio digital signal interface; 2—transmitter; 3—wireless headset body; 11—fiber-optic receiving head; 12—USB interface; 21—photoelectric conversion circuit; 22—USB interface signal receiving circuit; 23—first wireless transmitting module; 31—left and right horns; 32—microphone; 33—second wireless transmitting module; 34—DA/AD conversion circuit; 35—chat volume controller; 36—game volume controller; 37—microphone muteness controller; 38—indicating lamp.

DETAILED DESCRIPTION OF THE PREFERRED EMBODIMENT

Figure 1:
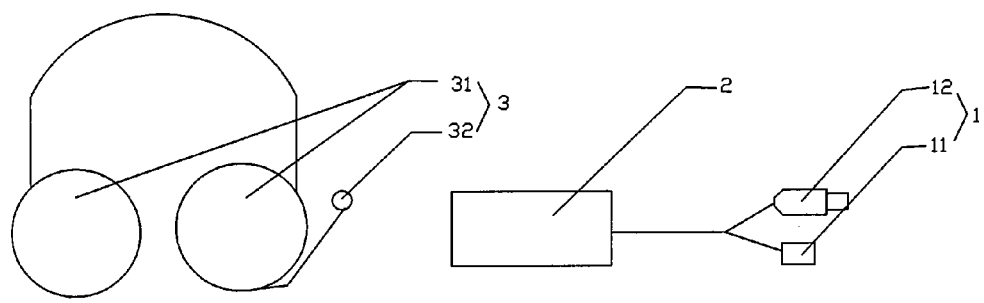
FIG. 1 is a sketch view of an optical fiber decoding-based wireless gaming headset according to a preferred embodiment of the present invention.
Figure 2:
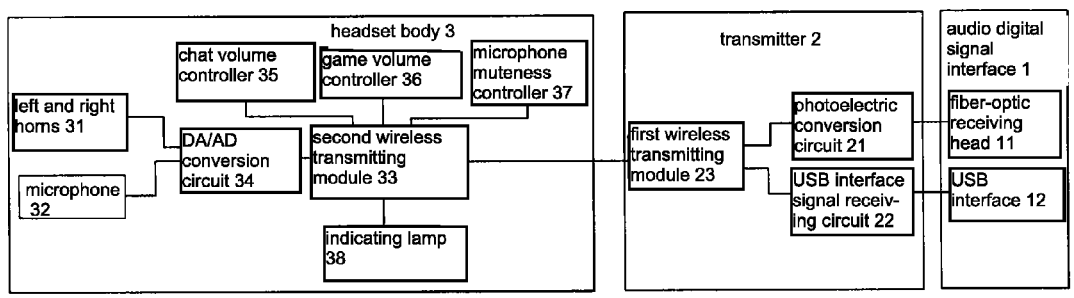
FIG. 2 is a circuit diagram of the optical fiber decoding-based wireless gaming headset according to the preferred embodiment of the present invention.

Referring to FIGS. 1 and 2, the present invention provides an optical fiber decoding-based wireless gaming headset, comprising: an audio digital signal interface 1, an emitter 2 and a wireless headset body 3;

wherein the audio digital signal interface 1 is electrically connected with the emitter 2, and the emitter 2 is in a wireless communication connection with the wireless headset body 3;

the audio digital signal interface 1 comprises an optical fiber receiving head 11 for receiving a sound optical fiber signal generated by a game console and a USB interface 12 for receiving online chatting digital signals;

the transmitter 2 comprises a photoelectric conversion circuit 21, a USB interface signal receiving circuit 22 and a first wireless transmitting module 23;

the wireless headset body 3 comprises left and right horns 31, a microphone 32, a second wireless transmitting module 33 and a DA/AD conversion circuit 34;

the fiber-optic receiving head 11 is electrically connected with the first wireless transmitting module 23 via a photoelectric conversion circuit 21, the USB interface 12 is electrically connected with the first wireless transmitting module 23 via the USB interface signal receiving circuit 22, the first wireless transmitting module 23 is communicated with the second wireless transmitting module 33, the second wireless transmitting module 33 is electrically connected with the DA/AD conversion circuit 34, the DA/AD conversion circuit 34 is respectively connected with the left and right horns 31 and the microphone 32.

Compared with the conventional art, the present invention provides an optical fiber decoding-based wireless gaming headset, wherein the audio digital signal interface 1 comprises two signal receiving devices of the fiber-optic receiving head 11 and the USB interface 12. The fiber-optic receiving head 11 and the USB interface 12 respectively receive the sound optical fiber signal and an online chatting digital signal. The sound optical fiber signal received is converted to an electric signal via the photoelectric conversion circuit 21 to be sent to the first wireless transmitting module 23. The online chatting digital signal is sent to the first wireless transmitting module 23 via the USB interface signal receiving circuit 22. The first wireless transmitting module 23 sends the two signals to the second wireless transmitting module 33, the DA/AD conversion circuit 34 of the wireless headset body 3 decodes the signals, and the signals are changed back to voice and then played by the left and right horns 31. Thus the optical fiber decoding-based wireless gaming headset of the present invention is not only capable of receiving game sound but also online chat sounds. In addition, a microphone 32 is provided on the wireless headset body 3, and the user is capable of chatting with friends via the microphone 32, so as to achieve playing games while chatting and accomplishing a better entertaining effect.

In the preferred embodiment, a chat volume controller 35 and a game volume controller 36 are respectively provided on the wireless headset body 3; the chat volume controller 35 and the game volume controller 36 are electrically connected with the second wireless transmitting module 33. The chat volume controller 35 and the game volume controller 36 independently control chat volume and the background game volume, so as to independently decreasing the background game volume and independently increase the chat volume to achieve better chatting experience, in such a manner that the practicability of the headset is improved.

In the preferred embodiment of the present invention, a microphone muteness controller 37 is provided on the wireless headset body 3, and the microphone muteness controller 37 is electrically connected with the second wireless transmitting module 33. The microphone muteness controller 37 is capable of controlling switching on/off of the microphone 32, so the microphone 32 is only turned on only when chatting with friends, and the microphone 32 is turned off while singly playing games or listening to music, so as to achieve an object of conserving energy and prolonging service life of the microphone 32

According to the preferred embodiment of the present invention, indicating lamps 38 for indicating working states are respectively provided on the wireless headset body 3 and the transmitter 2. The indicating lamps 38 of the microphone 32 are capable of displaying different color to indicate the corresponding states. Working principle of the indicating lamps 38 of the wireless headset body 3 is identical to the working principle of the indicating lamps 38 of the microphone 32.

According to the preferred embodiment of the present invention, the wireless headset body 3 further comprises a charge jack, a charge management circuit, a lithium battery, a charging indicator, a power switch and a power supply circuit; wherein the charge jack is connected with the lithium battery via the charge management circuit, the lithium battery is electrically connected with the power switch via the power supply circuit, the lithium battery powers elements of the headset body via the power supply circuit, the charge management circuit is electrically connected with the charging indicator.

Power supply of the transmitter 2 is a 5V power provided by the USB interface 12. Power supply of the wireless headset body 3 is a built-in lithium battery which is capable of charging repeatedly via a charging interface for utilizing, so as to decreasing the usage cost of the wireless headset. In addition, the indicating lamps 38 are capable of indicating the charging states, so as to facilitate the charging operation of a user.

According to the preferred embodiment of the present invention, both a transmitting frequency and a receiving frequency of the first wireless transmitting module and the second transmitting module are 2.4 GHz. The 2.4 GHz is a most widely used transmitting frequency, and the application technique is mature, and adopting the transmitting frequency is capable of decreasing the manufacture difficulty degree of a product. However, the transmitting frequency and the receiving frequency of the present invention are not limited to the frequency of 2.4 GHz, and other frequency can also be adopted.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An optical fiber decoding-based wireless gaming headset, comprising: an audio digital signal interface, an emitter and a wireless headset body;
   wherein the audio digital signal interface is electrically connected with the emitter, and the emitter is in a wireless communication connection with the wireless headset body;
   the audio digital signal interface comprises an optical fiber receiving head for receiving a sound optical fiber signal generated by a game console and a USB interface for receiving online chatting digital signals;
   the emitter comprises a photoelectric conversion circuit, a USB interface signal receiving circuit and a first wireless transmitting module;
   the wireless headset body comprises left and right horns, a microphone, a second wireless transmitting module and a DA/AD conversion circuit;
   the fiber-optic receiving head is electrically connected with the first wireless transmitting module via a photoelectric conversion circuit, the USB interface is electrically connected with the first wireless transmitting module via the USB interface signal receiving circuit, the first wireless transmitting module is communicated with the second wireless transmitting module, the second wireless transmitting module is electrically connected with the DA/AD conversion circuit, the DA/AD conversion circuit is respectively connected with the left and right horns and the microphone.

2. The optical fiber decoding-based wireless gaming headset, as recited in claim 1, wherein a chat volume controller and a game volume controller are respectively provided on the wireless headset body; the chat volume controller and the game volume controller are electrically connected with the second wireless transmitting module respectively.

3. The optical fiber decoding-based wireless gaming headset, as recited in claim 1, wherein a microphone muteness controller is provided on the wireless headset body, and the microphone muteness controller is electrically connected with the second wireless transmitting module.

4. The optical fiber decoding-based wireless gaming headset, as recited in claim 1, wherein indicating lamps for indicating working states are respectively provided on the wireless headset body and the emitter.

5. The optical fiber decoding-based wireless gaming headset, as recited in claim 1, wherein the wireless headset body further comprises a charge jack, a charge management circuit, a lithium battery, a charging indicator, a power switch and a power supply circuit;
   wherein the charge jack is connected with the lithium battery via the charge management circuit, the lithium battery is electrically connected with the power switch via the power supply circuit, the lithium battery powers elements of the headset body via the power supply circuit, the charge management circuit is electrically connected with the charging indicator.

6. The optical fiber decoding-based wireless gaming headset, as recited in claim 1, wherein both a transmitting frequency and a receiving frequency of the first wireless transmitting module and the second transmitting module are 2.4 GHz.

* * * * *